United States Patent [19]

Chen

[11] Patent Number: 5,005,066
[45] Date of Patent: Apr. 2, 1991

[54] SELF-ALIGNED NPN BIPOLAR TRANSISTOR BUILT IN A DOUBLE POLYSILICON CMOS TECHNOLOGY

[75] Inventor: Kueing-Long Chen, Plano, Tex.

[73] Assignee: Texas Instruments Incorporated, Dallas, Tex.

[21] Appl. No.: 455,769

[22] Filed: Dec. 28, 1989

Related U.S. Application Data

[60] Continuation of Ser. No. 184,737, Apr. 22, 1988, abandoned, which is a division of Ser. No. 57,586, Jun. 2, 1987, Pat. No. 4,784,966.

[51] Int. Cl.$^5$ .................................. H01L 27/02
[52] U.S. Cl. ............................ 357/43; 357/42; 357/41; 357/59; 357/35; 357/23.5; 357/23.14
[58] Field of Search ................ 357/41, 42, 43, 59 H, 357/35, 23.5, 23.14, 34

[56] References Cited

U.S. PATENT DOCUMENTS

| | | | |
|---|---|---|---|
| 4,115,797 | 9/1978 | Hingarh et al. | 357/35 X |
| 4,131,908 | 12/1978 | Daub et al. | 357/35 X |
| 4,234,362 | 11/1980 | Riseman | 357/59 H X |
| 4,259,680 | 3/1981 | Lepselter et al. | 357/35 |
| 4,408,388 | 10/1983 | Kameyama | 357/59 H X |
| 4,437,897 | 3/1984 | Kemlage | 148/1.5 |
| 4,445,268 | 5/1984 | Hirao | 437/31 |
| 4,477,965 | 10/1984 | Blossfeld | 437/31 |
| 4,481,706 | 11/1984 | Roche | 29/577 |
| 4,483,726 | 11/1984 | Isaac et al. | 437/31 |
| 4,484,211 | 11/1984 | Takemoto et al. | 357/50 |
| 4,484,388 | 11/1984 | Iwasaki | 357/571 |
| 4,495,010 | 1/1985 | Kranzer | 437/31 |
| 4,507,847 | 4/1985 | Sullivan | 357/576 B |
| 4,539,742 | 9/1985 | Kanzaki et al. | 29/576 |
| 4,550,490 | 11/1985 | Blossfeld | 437/31 |
| 4,583,106 | 4/1986 | Anantha et al. | 357/35 |
| 4,616,405 | 10/1986 | Yasuoka | 29/578 |
| 4,646,425 | 3/1987 | Owens et al. | 29/571 |
| 4,745,080 | 5/1988 | Scovell et al. | 357/59 H X |

FOREIGN PATENT DOCUMENTS

| | | | |
|---|---|---|---|
| 0052038 | 5/1982 | European Pat. Off. | 357/35 |
| 0066280 | 12/1982 | European Pat. Off. | 148/DIG. 91 |
| 59-34660 | 2/1984 | Japan | 357/59 H |

OTHER PUBLICATIONS

Gosney, "DIFMOS-A Floating-Gate Electrically Erasable Nonvolatile Semiconductor Memory Technology," *IEEE Transactions on Electron Devices*, vol. ED-24, No. 5, May 1977, pp. 594-599.

Watanabe et al., "High Speed BiCMOS VLSI Technology With Buried Twin Well Structure," *IEDM* 1985, pp. 423-426.

Sakurai et al., "A New Transistor Structure for High Speed Bipolar LSI", Japanese Journal of Applied Physics, vol. 19 (1980), Supp. 19-1, pp. 181-189.

"Surprise! ECL Runs on Only Microwatts", Electronics Magazine, Apr. 7, 1986, pp. 35-38.

*Primary Examiner*—William Mintel
*Attorney, Agent, or Firm*—B. Peter Barndt; James T. Comfort; Melvin Sharp

[57] ABSTRACT

The present invention provides a method, and a product made by the same, of fabricating an NPN bipolar transistor of a novel design simultaneously with the fabrication of double polysilicon CMOS/FAMOS devices, on an integrated circuit device. N wells 14 and 16 for the NPN transistor and the PMOS device are fabricated simultaneously. P type material is implanted to form the voltage adjust implant layer 19 of the FAMOS structure, and the base layer 18 of the NPN bipolar transistor, in the same process steps. In the process steps of forming the floating gate structure 36 of the FAMOS transistor, a polysilicon region 34 is also formed on the NPN transistor site. This polysilicon region 34 serves as a self-aligned implant mask during the implant of the base regions 88 of the NPN transistor. N type material is implanted in the same process steps to form the source and drain regions 66 of the FAMOS transistor and the emitter region 64 of the NPN transistor. N type material is implanted in the same process steps into the source and drain regions 86 of the NMOS transistor, and the collector regions 85 of the NPN transistor. P type material is implanted in the same process steps into the source and drain regions of the PMOS transistor 90, and into the base region 88 of the NPN transistor.

10 Claims, 5 Drawing Sheets

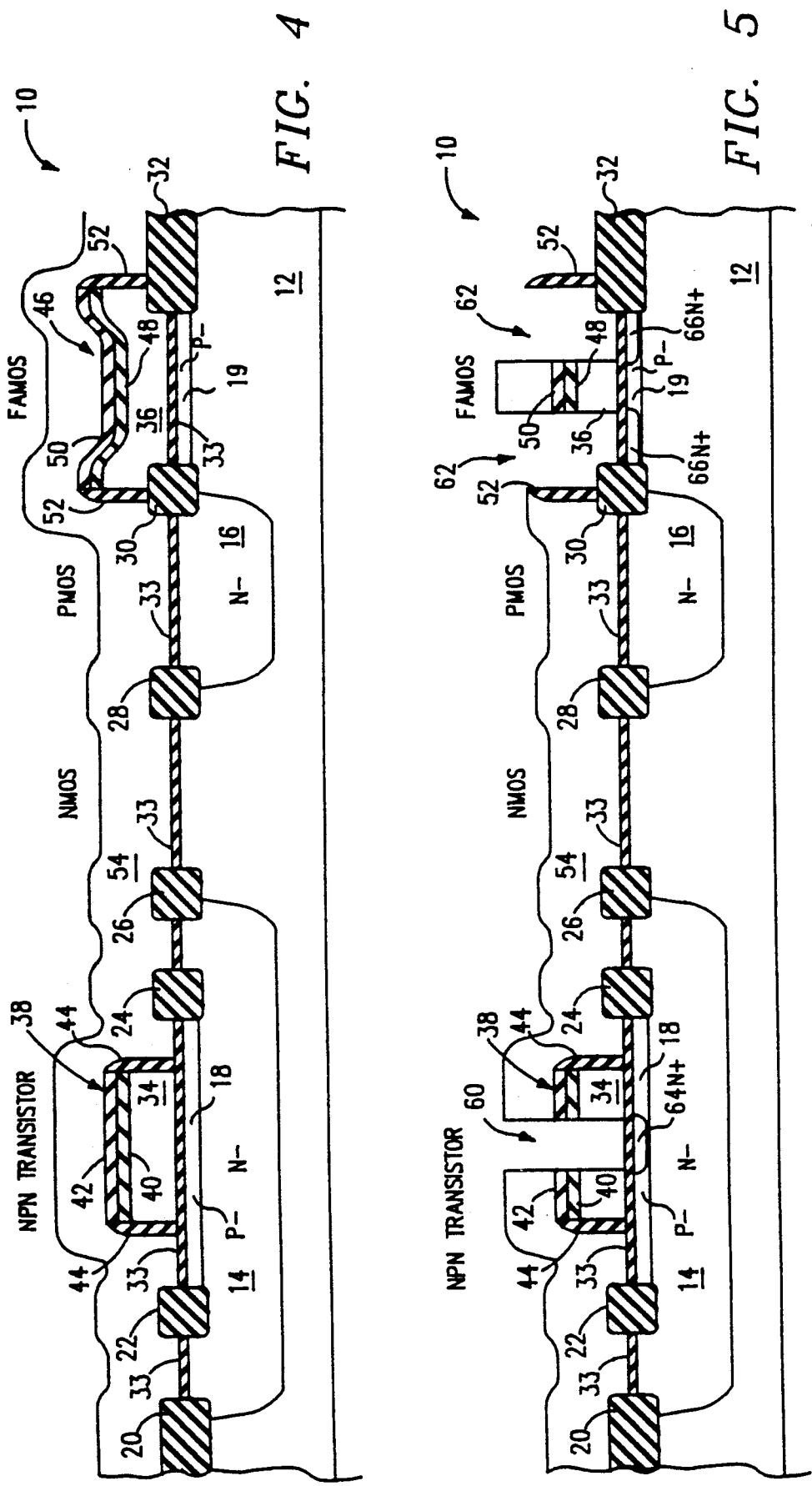

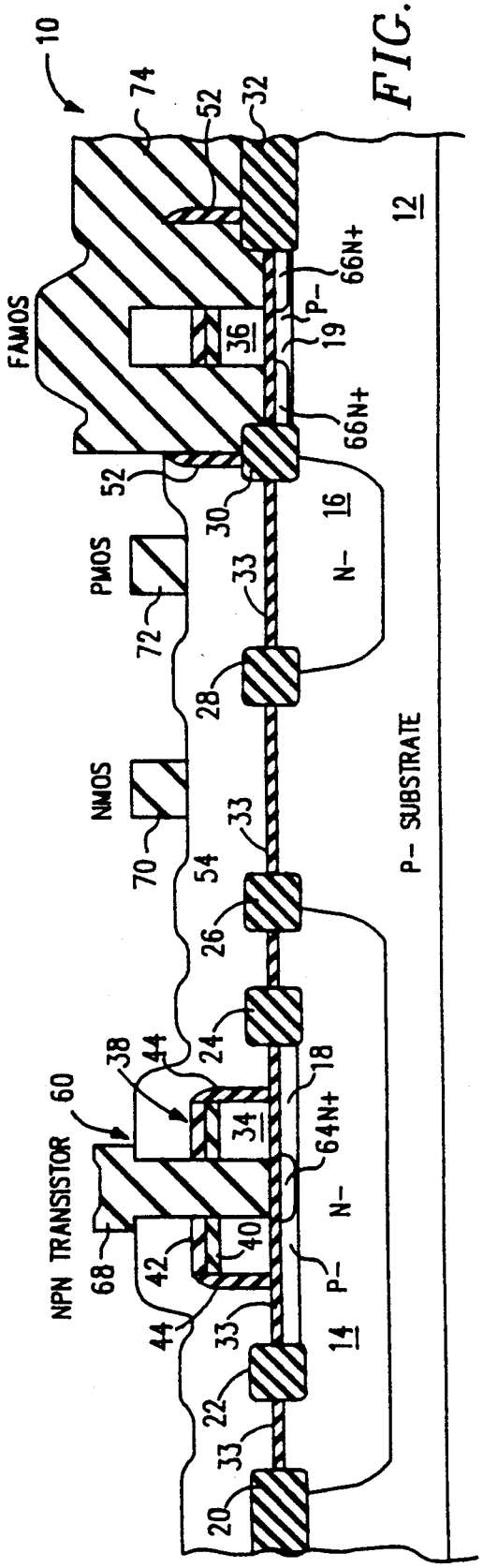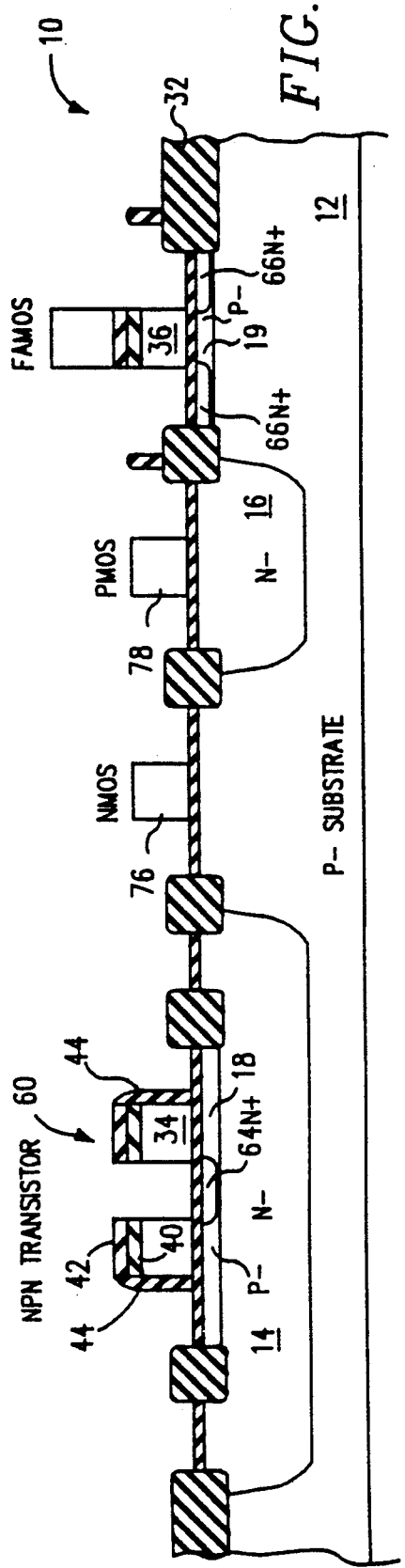

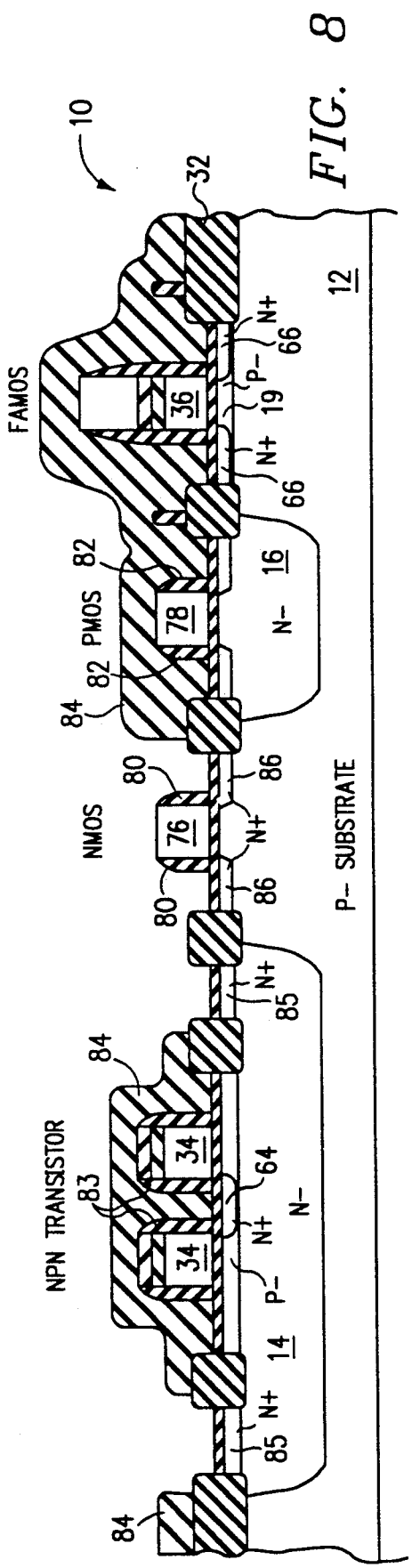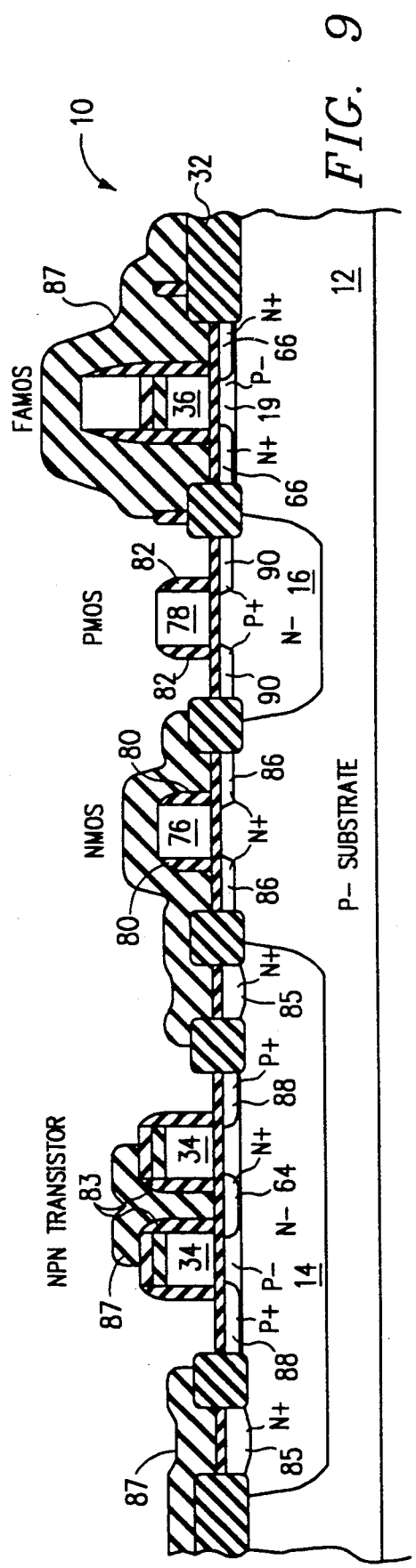

SELF-ALIGNED NPN BIPOLAR TRANSISTOR BUILT IN A DOUBLE POLYSILICON CMOS TECHNOLOGY

This is a continuation of application Ser. No. 184,737, filed Apr. 22, 1988, now abandoned, which is a division of application Ser. No. 07/057,586, filed on June 2, 1987, now U.S. Pat. No. 4,784,966.

BACKGROUND OF THE INVENTION

The fabrication of semiconductor devices typically involves a series of fabrication steps or processes operations to produce the desired structures and circuits in the semiconductor device. Depending on the types of structures and circuits desired on the semiconductor device, varying sequences of process steps are used in the production of the device.

Of course, production is less costly in most cases if the number of processing steps needed to arrive at a finished semiconductor device can be minimized. A minimization of process steps in most cases also serves to decrease the probability of errors occurring in the manufacture of the device. Once a series of process steps has been developed for manufacturing a certain device, it is economically costly to revise those steps. Such revision frequently requires changes in the processing operations in the manufacturing facility, possibly requiring new equipment, changes in existing equipment, alterations in production flow and operation sequences as well as other changes. Additionally, any change in the fabrication of the semiconductor device must be studied carefully and also refined to avoid possible adverse effects to the device arising from the changed processes.

There are several general types of semiconductor devices, each having its own field of fabrication technology. One general type of semiconductor device comprises an integration of CMOS (complimentary metal oxide semiconductor) structures and double polysilicon FAMOS (floating gate avalanche metal oxide semiconductor) structures in one semiconductor device referred to herein as a CMOS/FAMOS device. It should be understood that CMOS devices comprise integration of NMOS (N channel field effect transistors) and PMOS (P channel field effect transistors) devices. A particular series of process steps or fabrication technology has been developed for manufacturing the CMOS/FAMOS semiconductor devices. For the sake of clarity, this fabrication technology is referred to herein as double polysilicon CMOS technology, or simply CMOS technology.

Another general type of semiconductor device comprises bipolar transistor structures in the semiconductor device. A particular fabrication technology, referred to herein as bipolar technology, has been developed for manufacturing bipolar transistors on semiconductor devices.

With the development of new semiconductor circuit designs, including those for analog type circuits, it has become desirable to provide, on the CMOS/FAMOS type semiconductor devices, transistors having a high transconductance. Such transistors would provide a high drive capability for the circuits of the device and, consequently, improve the circuit speed of the device. However, for a given transistor structure size, CMOS structures provide a relatively low drive capability in comparison with that of bipolar transistors. Accordingly, it is desirable to integrate bipolar transistors, due to their high transconductivity and consequent high drive capability, into semiconductor devices which embody CMOS/FAMOS structures.

However, the conventional fabrication technology for bipolar transistor structures and that of typical CMOS/FAMOS structures do not coincide. As a result, when it is desired to integrate bipolar transistors with CMOS/FAMOS structures on a semiconductor device, separate fabrication steps are necessary to form the bipolar devices and the CMOS/FAMOS device, i.e., a series of fabrication steps must be carried out to form the bipolar transistor and a separate series of steps carried out to form the CMOS/FAMOS structures. Consequences of these increased steps are increased manufacturing costs as well as decreased reliability of manufacture due to the greater number of steps required for the manufacturing process. As a result, the need exists for a process to fabricate bipolar transistor devices on a semiconductor device simultaneously with fabrication of CMOS/FAMOS structures on the same device using conventional CMOS fabrication technology and without the introduction of separate and additional processing steps to fabricate the bipolar devices.

SUMMARY OF THE INVENTION

The present invention provides a method of fabricating an NPN bipolar transistor of a novel design simultaneously with the fabrication of double polysilicon CMOS/FAMOS devices on an integrated circuit device. The bipolar transistor is fabricated on the device without the addition of extra masks or patterning steps above those for conventional CMOS double polysilicon integrated circuit fabrication. The integrated circuit device can include NMOS, PMOS and FAMOS structures, as well as the NPN bipolar transistor and other devices or structures as desired.

The present invention utilizes the method steps for conventional double polysilicon CMOS fabrication to also fabricate an NPN bipolar transistor of a novel design. The conventional CMOS technology step of forming an N well for the PMOS device, is used also to form an N well to serve as the collector region of the NPN transistor. The conventional CMOS process step of implanting P type material for the threshold voltage implant of the FAMOS transistor structure, also serves as an implant step of the P type material to serve as the base layer of the NPN bipolar transistor. The step in CMOS technology of implanting N type material for the source and drain regions of the FAMOS transistor is used to implant the emitter layer of the NPN transistor. The CMOS technology step of implanting N type material into the source and drain regions of the NMOS transistor is used also to implant the collector contact regions of the NPN transistor. The CMOS technology step of implanting P type material in the source and drain regions of the PMOS transistor is used to implant the base contact of the NPN transistor.

Additionally, a first polysilicon layer formed during the formation of the floating gate layer of the FAMOS structure, serves as a self-aligned implant mask for the emitter and base regions of the NPN transistor. This advantageously provides for a reduced size of the NPN transistor which leads to enhanced performance of that transistor.

The present invention also provides the advantage of a process for the fabrication of an NPN bipolar transistor on an integrated circuit device having CMOS and FAMOS structures without the addition of extra masks or patterning steps above those for conventional CMOS double polysilicon circuit fabrication.

The present invention also advantageously provides a novel NPN bipolar transistor structure.

BRIEF DESCRIPTION OF THE DRAWINGS

The present invention will be described with reference to the accompanying drawings, wherein:

FIG. 4 shows a cross-sectional side view of the integrated circuit device of FIG. 3 according to an embodiment of the present invention, showing a layer of a second polysilicon material formed on the surface of the device;

FIG. 5 shows a cross-sectional side view of the integrated circuit device of FIG. 4, which, according to an embodiment of the present invention, has been etched to provide an emitter hole for the NPN bipolar transistor, and to form the stack gate structure of the FAMOS, additionally, the emitter region of the NPN transistor and the source and drain regions of the FAMOS have been implanted with N type material;

FIG. 6 shows a cross-sectional side view of the integrated circuit device of FIG. 5 according to an embodiment of the present invention, wherein a layer of photoresist has been formed on the device and patterned to protect the NPN transistor and FAMOS structure and to define the gates for the NMOS and PMOS structures;

FIG. 7 shows a cross-sectional side view of the integrated circuit device of FIG. 6 according to an embodiment of the present invention, wherein the second layer of polysilicon material has been etched to form gates for NMOS and PMOS structures, and a photoresist layer has been removed;

FIG. 8 shows a cross-sectional side view of the integrated circuit device of FIG. 7 according to an embodiment of the present invention, wherein N type material has been implanted in the collector regions of the NPN transistor and in the source and drain regions of the NMOS structure;

FIG. 9 shows a cross-sectional side view of the integrated circuit device of FIG. 8 according to an embodiment of the present invention, wherein a P type material has been implanted into the base regions of the NPN transistor, and into the source and drain regions of the PMOS structure;

DETAILED DESCRIPTION OF THE INVENTION

The present invention provides a product formed by and a method for forming bipolar transistor structures on an integrated circuit device fabricated using CMOS technology. The bipolar transistors are fabricated on the device without the addition of extra masks or patterning steps above those for conventional double polysilicon CMOS device fabrication. The present invention makes use of the first layer of polysilicon material as a self-aligned structure for the process steps of implanting the emitter and base regions of the NPN bipolar transistor with the desired doping materials.

Described in conjunction with FIGS. 1 through 10, below is an embodiment of the present invention wherein an NPN bipolar transistor is fabricated on an integrated circuit device during the same fabrication steps by which NMOS, PMOS and FAMOS structures are also fabricated with conventional CMOS fabrication technology. FIGS. 1-9 illustrate fabrication steps in the embodiment described and FIG. 10 illustrates the semiconductor device of the embodiment at a relatively advanced stage of fabrication.

Figure 10:
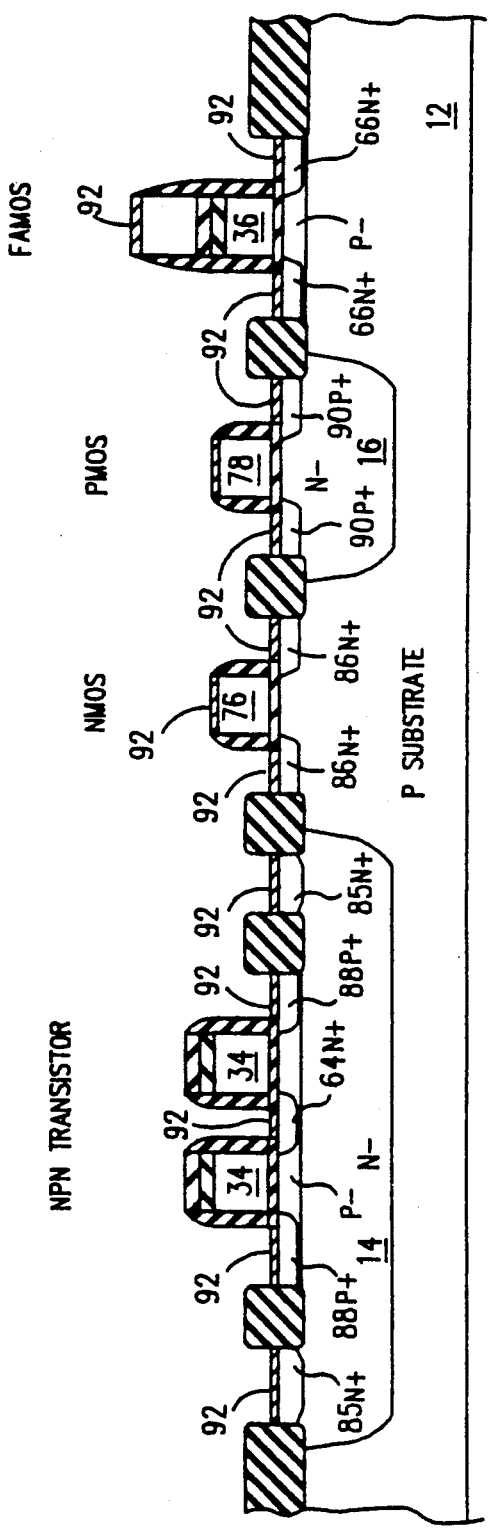
FIG. 10 shows a cross-sectional side view of the integrated circuit device of FIG. 9 according to an embodiment of the present invention, wherein highly conductive surfaces have been formed on the collector, base and emitter regions of the NPN transistor and on the source, drain and gate regions of the NMOS, PMOS and FAMOS structures.

Detailed reference is first made to FIG. 10 which shows a cross-sectional side view of an integrated circuit device according to an embodiment of the present invention. FIG. 10 shows an NPN transistor, as well as NMOS, PMOS and FAMOS structures, each at a relatively advanced stage of fabrication. Also shown in FIG. 10 are the emitter 64, base regions 88 and collector regions 85 of the NPN transistor and the source, drain and gate regions of the NMOS, PMOS and FAMOS structures. The source and drain regions of the NMOS are shown at 86, the gate of the NMOS is shown at 76. The source and drain regions of the PMOS are shown at 90, the gate of the PMOS is shown at 78. The source and drain regions of the FAMOS are shown at 66. In FIG. 10, the P+ and N+ symbols designate regions which have been heavily doped while the P− and N− symbols designate regions which have been lightly doped. FIGS. 1-9 illustrate process steps according to an embodiment of the present invention leading to the device of FIG. 10. The process steps of FIGS. 1-9 are described below.

Figure 1:
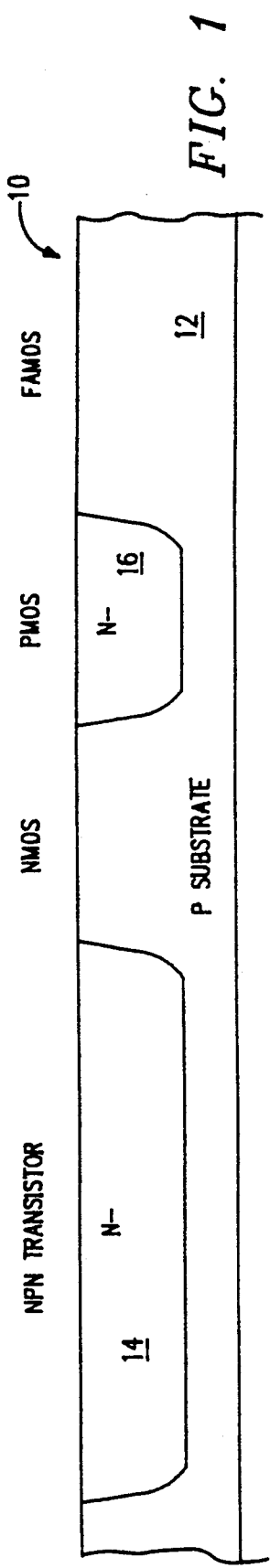
FIG. 1 shows a cross-sectional side view of the integrated circuit device of FIG. 10 at an early stage of fabrication and illustrates the process steps of forming N wells in a P type substrate for the NPN transistor and the PMOS device.

FIG. 1 shows a cross-sectional side view of the integrated circuit device of FIG. 10 at an early stage of fabrication and illustrates an embodiment of the present invention. Shown in FIG. 1 is a device 10 including a substrate 12 comprising a P type material. Also labeled in FIG. 1 are areas wherein will be fabricated an NPN transistor, an NMOS structure, a PMOS structure and a FAMOS structure as more completely shown in FIG. 10. FIG. 1 illustrates a step in the fabrication of the device 10 wherein wells 14 and 16 of N type material have been formed by conventional techniques in regions corresponding to the sites of the NPN transistor and the PMOS structure respectively. Well 16 serves as the N well of the completed PMOS device. Well 14 serves as the collector region of the completed NPN transistor. According to the embodiment of the present invention, wells 14 and 16 are formed simultaneously with each other and in the same series of process steps. According to the embodiment of the present invention, wells 14 and 16 have been lightly doped with N type material.

Figure 2:
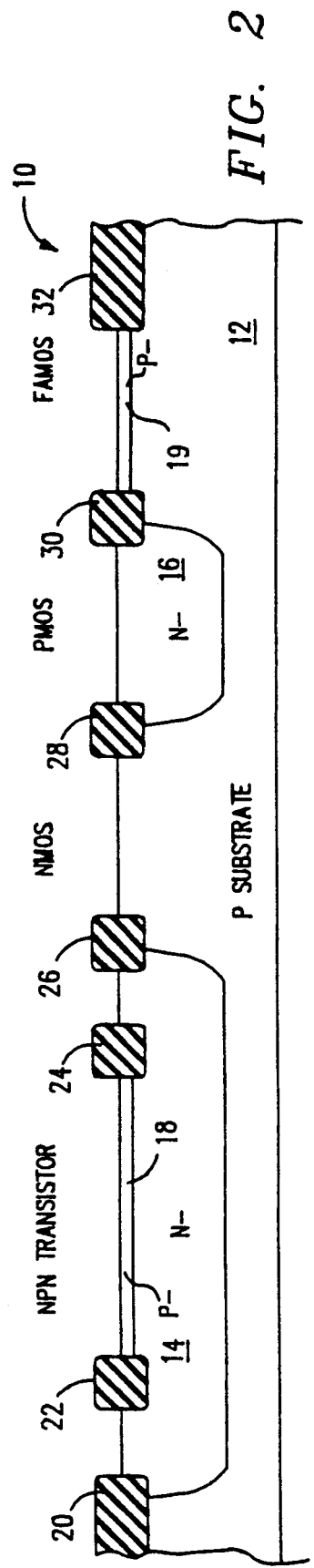
FIG. 2 shows a cross-sectional side view of the integrated circuit device of FIG. 1, wherein, according to an embodiment of the present invention, field oxide structures have been formed on the substrate and P type material has been implanted into the base region of the NPN transistor and as the threshold voltage implant of the FAMOS device.

FIG. 2 shows a cross sectional side view of the integrated circuit device of FIG. 1 illustrating additional steps in the fabrication of the semiconductor device 10. FIG. 2 shows that field oxide structures 20, 22, 24, 26, 28, 30 and 32 have been formed on the surface of the device 10 for isolation of structures to be formed on the device. The field oxide structures in the embodiment described are about 6000 angstroms thick, but may be of greater or smaller dimension as desired for the desired isolation function. Also shown in FIG. 2, regions of the substrate 12 have been lightly doped or implanted as shown with P type material to form the base region 18 of the NPN transistor, and the threshold voltage adjust implant 19 of the FAMOS transistor structure. According to the embodiment of the present invention, the implanting of P type material into the base region 18 is accomplished simultaneously with and in the same series of process steps as the implant of P type material into the threshold voltage implant 19 region. The dopant implanted at regions 18 and 19 can comprise boron, or other appropriate dopant materials.

Figure 3:
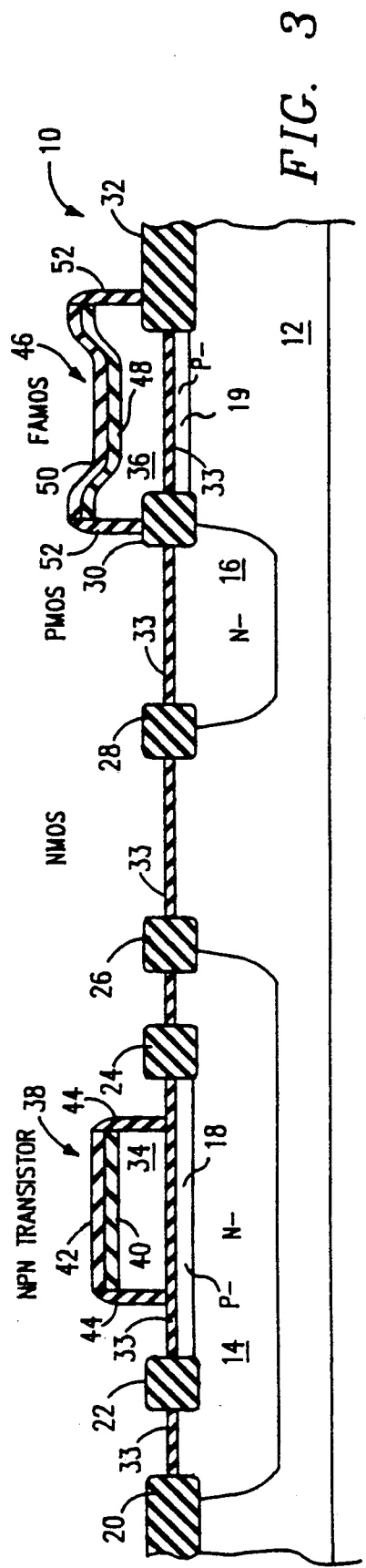
FIG. 3 shows a cross-sectional side view of the integrated circuit device of FIG. 2 according to an embodiment of the present invention, showing the regions of a first polysilicon layer that have been formed on the device as well as regions of gate oxide, interlayer oxide and side wall oxide that have also been formed on the device.

FIG. 3 shows a cross-sectional side view of the integrated circuit device of FIG. 2, illustrating additional steps in the fabrication of the device. As shown in FIG. 3, a layer of gate oxide material 33 has been formed across the surface of the device. The layer of gate oxide 33 is about 250 Angstroms thick, but may be of greater or smaller thickness as desired. Also shown in FIG. 3, a region 34 of a first polycrystalline silicon, commonly termed polysilicon, has been formed between field oxide regions 22 and 24. A second region 36 of the first polysilicon material has been formed between field oxide regions 30 and 32 as shown in FIG. 3. According to the embodiment of the present invention, first and second regions of first polysilicon material 34 and 36, respectively, are formed simultaneously with each other in the same series of process operations. Regions 34 and 36 can be formed by conventional techniques comprising forming a layer of polysilicon material on the surface of the device 10 and then etching the layer to remove all but regions 34 and 36 of the polysilicon layer. Regions 34 and 36 are about 3000 Angstroms thick but may be of greater or lesser thickness as desired.

As also shown in FIG. 3, interlayer oxide layer 38 has been formed on the surface of the first region 34 of polysilicon material. Interlayer oxide layer 38 comprises a layer of silicon dioxide material 40 formed on the surface of the first polysilicon region 34 and a layer of silicon nitride ($Si_3N_4$) material 42 formed on the surface of the layer of oxide material 40 as shown in FIG. 3. Layers 40 and 42 are each about 250 Angstroms thick but may be of greater or lesser thickness as desired. Additionally, side wall oxide regions 44 have been formed on the sides of the first polysilicon region 34 and interlayer oxide 38. As also shown in FIG. 3, interlayer oxide 46 has been formed on the second region 36 of the first polysilicon material. Interlayer oxide 46 comprises a layer of silicon dioxide material 48 formed on the surface of the second region 36 of the first polysilicon material and a layer of silicon nitride ($Si_3N_4$) material 50 formed on the surface of the silicon dioxide layer 48. Side wall oxide regions 52 have been formed on the sides of the second region 36 of first polysilicon material and interlayer oxide layer 46.

FIG. 4 shows a cross-sectional side view of the device shown in FIG. 3 showing an additional step in the fabrication of the device. As shown in FIG. 4, a layer 54 of a second polysilicon material has been formed on the surface of the device. The layer of second polysilicon material 54 may comprise the same material as the first layer of polysilicon material of which regions 34 and 36 are formed, or it may be of a different polysilicon material.

FIG. 5 shows a cross-sectional side view of the integrated circuit device of FIG. 4 illustrating additional steps in an embodiment of the present invention. As shown in FIG. 5, an emitter hole or region 60 for the NPN structure has been etched through the second polysilicon layer 54, the interlayer oxide layer 38, the first polysilicon region 34 and gate oxide layer 33. In the same etch process, the stack gate structure of the FAMOS structure is etched by etching source and drain regions 62 through the second polysilicon layer 54, the interlayer oxide layer 48, first polysilicon layer region 36 and gate oxide layers 33 as shown in FIG. 5. FIG. 5 is also illustrated in the additional step of the embodiment of the present invention wherein a heavy doping of an N type material is implanted at 64 and 66 respectively into portions of the regions 18 and 19 wherein P type material had been implanted as shown in FIG. 2. The implant of the N type material to regions 64 and 66 is made through emitter hole 60 and source/drain regions 62, respectively. As will be seen in FIG. 10, the region at 64, heavily doped with N type material, serves as the emitter of the completed NPN bipolar transistor. The regions 66, heavily doped with N type material, serve as the source and drain regions of the FAMOS transistor of the completed device. During the implant of the emitter region 64, the first and second polysilicon layers, 34 and 54, serve as implant masks, insuring that the N type material is implanted into the precisely correct region 64. The advantages of the present invention in having the first polysilicon layer 34 serve as a self-aligned implant mask will become even more apparent in the additional description below.

Additionally, it is not necessary that the exposed areas of the gate oxide layer 33 be completely removed during the etch process. Doping of the desired regions can occur even if some of the gate oxide layer 33 remains. As will be discussed below in conjunction with FIG. 10, areas of gate oxide remaining on contact surfaces are removed later in fabrication, commonly with a wet chemical strip step.

The dopant implanted into regions 64 and 66 as shown in FIG. 5 can comprise arsenic, phosphorus or other suitable materials. According to the embodiment of the present invention, the etch and doping of region 64 is accomplished simultaneously with and in the same process steps as the etching and doping of regions 66.

FIG. 6 is a cross-sectional side view of the integrated circuit device of FIG. 5 illustrating additional steps in the embodiment of the present invention. As shown in FIG. 6, a layer of photoresist material has been formed over the second layer of polysilicon material 54, and then patterned and developed to provide predetermined regions of photoresist. As shown in FIG. 6, one of those predetermined regions of photoresist comprises a plug 68 protecting the emitter hole 60 and emitter surface 64. Additional predetermined regions of photoresist comprise protective regions 70 and 72 over those regions of the second layer of polysilicon material 54 which will become the gates of the NMOS and PMOS structures as more fully shown below. Another predetermined region of photoresist comprises a protective region 74 over the source, drain and stack gate regions of the FAMOS device.

FIG. 7 shows a cross-sectional side view of the integrated circuit device of FIG. 6 illustrating additional steps in the embodiment of the present invention. As shown in FIG. 7, a plasma etch has been conducted to form the gate structures 76 and 78 of the NMOS and PMOS structures, respectively. Additionally, the photoresist material as shown at 68, 70, 72 and 74 of FIG. 6 has been removed after the plasma etch.

FIG. 8 shows a cross-sectional side view of the integrated circuit device of FIG. 7 and illustrates additional steps in the embodiment of the present invention. As shown in FIG. 8, sidewall oxide regions 80 and 82 have been formed on gates 76 and 78 respectively. Additionally, sidewall oxide region 83 has been formed on the interior surface of the emitter hole 60 of the NPN transistor as shown in FIG. 8. Next, the collector regions 85 of the NPN transistor and the source and drain regions 86 of the NMOS structure are heavily doped with N type material. Suitable N type materials for this heavy doping include arsenic, phosphorus or other materials as appropriate. It should be understood that the process of implanting the N type material into the desired regions is according to conventional methods and typically comprises first covering the device with a photoresist material and then patterning the photoresist material to expose the regions which are to be implanted with the N type material.

As also shown in FIG. 8, a layer of photoresist 84 has been applied over the surface of the device and then patterned to expose selected regions of the device. The regions exposed include the collector regions 85 of the NPN transistor and the source and drain regions 86 of the NMOS device. As also shown in FIG. 8, a heavy doping of N type material has been implanted in the collector regions 85 and source and drain regions 86. The layer of photoresist 84 shown in FIG. 8 is illustrative of the photoresist layer which is used to define the regions in which the N type material will be implanted. After the implant is completed, the layer of photoresist material 84 is removed.

FIG. 9 shows a cross-sectional side view of the integrated circuit device of FIG. 8 illustrating additional steps in the fabrication of the embodiment. As shown in FIG. 8, the next primary step in the embodiment being described is to heavily dope the base regions 88 of the NPN transistor and the source and drain regions 90 of the PMOS transistor by an implant of P type material. As also shown in FIG. 9, this is accomplished by forming a layer of photoresist material 87 over the surface of the device, patterning the photoresist, and then removing those portions of photoresist which cover the regions to be doped. Looking particularly at the NPN structure in FIGURE 9, it can be seen that the edges of the photoresist material 87 adjoining those regions 88 which are to be doped are shown in FIG. 9 to be somewhat spaced back from the edge of regions 88. This spaced back orientation corresponds to the misalignment tolerance which must be designed into such photoresist patterning steps to allow for misalignment during patterning. As is known in the art, those portions of the device covered by photoresist 87, e.g., the emitter region 64, are not doped during the implantation step.

Particular advantages of the present invention are realized in the process steps illustrated in conjunction with FIG. 9. These advantages arise from the use of the regions of the first polysilicon layer 34 as self-aligned implant masks during the implantation of P type material into the base regions 88. As is shown in FIG. 9, a layer of photoresist is formed on the device, and then patterned to provide masking regions 87 over preselected regions of the device. With regard particularly to the NPN structure of the device, it can be seen that the photoresist material 87 covers the emitter region 64 and protects that region from implantation of P type material during this step. As also illustrated in FIG. 9, however, the regions of photoresist material 87 do not extend completely to the shoulder of the region of the first polysilicon material 34 which adjoins the base regions 88, but rather these edges of the photoresist are spaced back from the shoulder of the first region of polysilicon material 34. As explained previously, this spaced back orientation of the photoresist is due to misalignment tolerances in photoresist patterning. However, this spaced back arrangement does not adversely affect the accuracy of the implantation of the P type material because the first region of polysilicon material 34 itself serves as the implant mask for the base regions base regions 88. Accordingly, the first polysilicon material 34 acts as a self-aligned implant mask during the implant of the P type material.

Particular advantages result from the use of regions of the first polysilicon layer 34 to form implant masks for both the implant of the NPN transistor emitter surface 64 and the implant of the base regions 88. Some of these advantages become increasingly apparent by reviewing the limitations of the photoresist patterning processes which would otherwise be necessary to produce the implants in regions 64 and 88. Photoresist patterning is subject to accuracy limitations due in a large part to the probability of misalignment of the slice under the mask during patterning. Accordingly, allowance must be provided in semiconductor device design geometries to allow for this misalignment possibility. Using the first polysilicon layer 34 as an implant mask in the present invention rather than the photoresist material allows the implant to be accomplished and the NPN transistor fabricated with smaller geometries than would be possible if the polysilicon layer were not used as an implant mask.

For example, if self-aligned techniques were not used, and instead multiple photoresist masks were used for the several implants in the NPN structure, the lateral geometries of the NPN structure from the emitter to the base regions would have to be in the 3-4 micron range. Such a relatively large geometry, however, would provide too great a distance between base regions 88 and the emitter region 64, thus resulting in an undesirably high base resistance due to the distance between the base and the emitter. This high resistance would adversely affect the NPN transistor characteristics such that the speed would be slower than desired. In the practice of the present invention, however, with the first polysilicon region 34 forming a ring around the emitter and serving as the self-aligned implant mask for the emitter and base region implants, the NPN transistor can be fabricated with a distance between the base and emitter regions of one micron or less. The ring of polysilicon of region 34 serves as a lateral spacer for the implant steps for the emitter and base regions. Accordingly, one advantage of the present invention is that the use of the first polysilicon layer 34 as a self-aligned implant mask, provides for fabrication of an NPN transistor having a desired small geometry which enhances the optimum performance of the transistor.

FIG. 10 shows a cross-sectional side view of the integrated circuit device of FIG. 9 wherein highly conductive surfaces 92 have been formed on the conducting surfaces of the NPN transistor as well as the NMOS, PMOS and FAMOS structures. The highly conductive surfaces 92 can be formed from titanium silicide, other metal silicides, or other materials as desired. The conductive layer 92 serves to reduce the sheet resistance of the conducting surfaces and to enhance electrical conductance through the contact surfaces to electrical contacts later formed to those surfaces. Prior to formation of the highly conductive surfaces 92 on the device, the gate oxide covering some of the contact surfaces can be removed by a wet chemical strip, which commonly comprises a hydrofluoric acid dip.

After the steps illustrated in FIG. 10, fabrication of the integrated circuit device of the figure is completed by steps known in the art, comprising forming a layer of interlayer oxide, etching contact holes, forming contacts and other steps.

It should be noted that in alternate embodiments of the present invention, it is not necessary that the first region of polysilicon material form a ring completely around the emitter of the NPN transistor. As an alternative, material of the first region of polysilicon material may comprise a structure in the form of one or more rectangular strips separating the emitter from the base regions. So also, the emitter and the base and collector regions may be of rectangular, strip or other design as desired.

One advantage of the present invention is that it produces an NPN transistor on an integrated circuit device during the same steps at which CMOS and FAMOS structures are fabricated on the device. Thus, the present invention forms the NPN transistor on the integrated circuit device without the addition of extra patterning or masking steps over those already necessary to form the CMOS and FAMOS structures.

In each of the implant steps, a number of different materials may be used. For the N type material implants, phosphorus, arsenic or other materials may be used. Materials which may be used for the P type material implants include boron, BF$_2$ or other materials.

It is pointed out that the present invention can be practiced by fabricating an NPN transistor as described either with or without either or any of the NMOS, PMOS or FAMOS structures also described.

The present invention, also, comprises a novel NPN transistor fabricated by processes conducive also to the fabrication of CMOS structures. The present invention also comprises a novel integrated circuit device including an NPN transistor of a novel structure in combination with CMOS and FAMOS structures.

The present invention is particularly advantageous in sense amplifier circuit designs where a driver with a high drive capability is needed to drive a large capacitance load. In such circuits, the speed of the circuits is enhanced significantly by the introduction of the NPN bipolar transistor of the present invention.

While the present invention has been described with respect to a preferred embodiment, it is to be understood that the invention is capable of numerous modifications by arrangement and changes therein which are within the scope of the invention as defined by the appended claims.

What is claimed is:

1. A semiconductor device having a floating gate avalanche metal oxide semiconductor (FAMOS) structure, an NPN bipolar transistor, an N-channel field effect transistor (NMOS) and a P-channel field effect transistor (PMOS) in a substrate, comprising:

N-type material reservoirs formed in areas of P type material in said substrate, said reservoirs of N type material corresponding to sites of the PMOS and NPN structures;

regions of P type material formed in said substrate, at least one of said regions of P type material formed to serve as a threshold voltage adjust implant of the FAMOS structure, and at least one portion of said regions of P type material formed in said N type material reservoir of said NPN transistor to serve as a base layer for the NPN transistor;

a layer of oxide for gates of the MOS transistors;

regions of a first polysilicon layer formed on regions of said substrate, at least one of said regions of the first polysilicon layer aligned over a portion of said base layer of P type material of the NPN transistor and at least one portion of said regions of the first polysilicon layer being formed to align with said threshold voltage adjust implant region at the site of the FAMOS structure;

an interlayer oxide layer formed on the regions of said first polysilicon layer;

a second layer of polysilicon material formed over portions of the substrate;

the first layer of polysilicon material having an emitter hole therethrough, thereby exposing the site of the emitter of the NPN transistor, and regions of the first and second layers of polysilicon material forming the stack gate structure of the FAMOS structure, the sites of a source and drain of the FAMOS structure being adjacent said regions forming the stack gate structure;

N type material implanted into said sites of the source and drain of the FAMOS structure, and N type material implanted into said site of said emitter of said NPN transistor, the emitter being self-aligned by the first polysilicon layer;

gates for the NMOS and PMOS structures formed from portions of said second layer of polysilicon material;

N type material implanted into regions on the body to form a collector region of the NPN transistor and a source region and drain region of the NMOS structure; and P type material implanted in a region of the base layer to form a P type doped base region(s) of the NPN transistor and a source region and drain region of the PMOS structure, the base region of the NPN transistor being self-aligned with said region of first polysilicon material aligned over said base layer, the doped base region being space apart from the emitter region, and having inner edges aligned with the region of the first polysilicon layer aligned over a portion of said base layer of P type material of the NPN transistor.

2. The semiconductor device of claim 1, further comprising: conductive surfaces formed on the collector, base and emitter regions of the NPN transistor, and on the source, drain and gate regions of the NMOS, PMOS and FAMOS structures.

3. A semiconductor device having a floating gate structure for a floating gate avalanche metal oxide semiconductor (FAMOS) and an emitter structure for an NPN transistor on a substrate comprising:

N type material reservoirs formed on areas of P type material on said substrate;

regions of P type material formed on said body, at least one of said regions of P type material formed to serve as a threshold voltage adjust implant of the FAMOS structure, and at least one of said regions of P type material formed on said N type material reservoir of said NPN transistor to serve as a base layer for the NPN transistor;

implant resistant regions of a first polysilicon containing layer formed on said substrate, at least one of said regions of the first polysilicon layer aligned over a portion of said base layer of P type material of the NPN transistor and at least one portion of said regions of the first polysilicon layer being formed to align with said threshold voltage adjust implant region at the site of the FAMOS structure, said region of the polysilicon layer over the base layer acting as a self-aligned implant mask during implanting of a P-type material into doped base region in the base layer;

an interlayer oxide layer formed on the regions of said first polysilicon layer;

a second layer of polysilicon material formed over portions of the substrate;

the first and second layers of polysilicon material having an emitter hole therethrough, thereby exposing the site of the emitter of the NPN transistor, and regions of the first and second layers of polysilicon material forming a stack structure of the FAMOS transistor, sites of a source and a drain of said FAMOS transistor being adjacent to said regions;

N type material implanted into said sites of the source and drain of the FAMOS transistor and into said emitter of the NPN transistor.

4. The semiconductor device of claim 3, further comprising an oxide layer formed over a portion of said base layer of P type material of the NPN transistor and at least one portion of the oxide layer formed over the substrate at the NMOS and PMOS regions and the threshold voltage implant region at the site of the FAMOS transistor.

5. An NPN bipolar transistor comprising: a substrate with a first region of material having a first conductivity type;

a second region of material having a second conductivity type over a preselected area of said first region, said second conductivity type being of an opposite conductivity type to that of the first conductivity type;

a masking layer of polysilicon material over a predetermined portion of said second region to prevent doping of the portion of the second region underlying said masking layer of polysilicon material;

an opening in a selected portion of said layer of polysilicon material to define a dopant exposed region on said body, including an emitter region, said emitter region being on a portion of said second region aligned with said opening in said polysilicon masking layer;

said emitter region doped such that said emitter region is of said first conductivity type;

said polysilicon masking layer shielding from said emitter doping, those remaining portions of the second region underlying the polysilicon;

preselected portions of said first region doped with a dopant of said first conductivity type to form a collector region for the NPN transistor;

preselected portions of said second region doped with a dopant of said second conductivity type to form a base region of said NPN transistor, said doped base region having inner edges aligned with said polysilicon masking layer.

6. An NPN bipolar transistor on a first region of P type material of a substrate, comprising:

an N well in a first region of P type material of the substrate;

at least one field oxide region on said substrate on said N well to separate a collector region from a base region of said NPN transistor;

P type material implanted into a predetermined region of said N well, said predetermined region to serve as the base region of the NPN bipolar transistor;

an implant resistant layer of polysilicon material on at least a portion of said predetermined region in which the P type material has been implanted;

an emitter hole through the layer of polysilicon material;

N type material implanted into the device through the emitter hole to form an emitter region of the NPN transistor and the remaining portion of said region underlying said polysilicon material shielded from the implanting;

N type material implanted into the collector region of the NPN transistor; and

P type material implanted into a portion of base region of the NPN transistor, the doped base region portion having inner edges aligned by said polysilicon material.

7. A semiconductor device having a floating gate avalanche metal oxide semiconductor (FAMOS) structure, an NPN bipolar transistor, an N-channel field effect transistor (NMOS) and a P-channel field effect transistor (PMOS) on a body, comprising:

N type material reservoirs on areas of P type material on said body, said reservoirs of N type material corresponding to sites for formation of the PMOS and NPN transistors;

regions of P type material on said body, at least one of said regions of P type material formed to serving as a threshold voltage adjust implant of the FAMOS structure, and at least one portion of said regions of said P type material formed on said N type material reservoir of said NPN transistor to serve as a base layer for the NPN transistor;

a layer of oxide for gates of MOS transistors and for resisting passage of implants from superior layers formed in regions aligned over portions of said base layer of P type material of the NPN transistor;

regions of a first polysilicon layer of said body, at least one of said regions of a first polysilicon layer aligned over a portion of said base layer of P type material of the NPN transistor and at least one portion of said regions of a first polysilicon layer being formed to align with said threshold voltage adjust implant region at the site of the FAMOS structure;

an interlayer oxide layer on the regions of said first polysilicon layer;

a second layer of polysilicon material over portions of the body;

an emitter hole through the first layer of polysilicon material, defining the site of the emitter of the NPN transistor, the first and second layers of polysilicon material forming the stack gate structure of the FAMOS structure and also thereby defining the sites of the source and drain of the FAMOS structure;

N type material implanted into said sites of the source and drain of the FAMOS structure exposed through said first and second layers of polysilicon materials, and N type material also implanted into said site of said emitter of said NPN transistor exposed through said first and second layers of polysilicon material;

N type material implanted into regions on the body to form a collector region of the NPN transistor and a source region and drain region of the NMOS structure; and P type material implanted in regions of the body to form extrinsic base region of the NPN transistor and a source region and drain region of the NMOS structure, said extrinsic base region having inner edges aligned by said polysilicon layer.

8. A semiconductor device having a floating gate structure for a floating gate avalanche metal oxide semiconductor structure (FAMOS) and an emitter structure for an NPN transistor on a body comprising:

N type material reservoirs on areas of P type material on said body;

regions of P type material on said body, at least one of said regions of P type material serving as a threshold voltage adjust implant of the FAMOS structure, and at least one of said regions of P type material formed on said N type material reservoir of said NPN transistor to serve as a base layer for the NPN transistor;

implant resistant regions of a first polysilicon containing layer on said body, at least one of said regions of a first polysilicon layer aligned over a portion of said base layer of P type material of the NPN transistor to self-align a base layer implant and at least one portion of said regions of a first polysilicon layer being formed to align with said threshold voltage adjust implant region at the site of the FAMOS structure;

an interlayer oxide layer on the regions of said first polysilicon layer;

a second polysilicon material over the body;

an emitter hole through the first and second layers of polysilicon material, thereby exposing the site of the emitter of the NPN transistor, and further holes through the first and second layers of polysilicon material of the FAMOS structure to form a stack structure of the FAMOS transistor and also thereby expose sites of a source and drain of said FAMOS transistor;

N type material implanted into said exposed sites of the source and drain of the FAMOS transistor and into said exposed emitter of the NPN transistor.

9. The semiconductor device of claim 8, wherein the implant resistant layer comprises an oxide layer.

10. A semiconductor device having a floating gate avalanche metal oxide semiconductor (FAMOS) structure, an NPN bipolar transistor, an N-channel field effect transistor (NMOS) and a P-channel field effect transistor (PMOS), comprising:

a substrate of semiconductor material of P type;

a first layer of semiconductor material over and insulated from said substrate, said first layer forming both a floating gate of said FAMOS structure and an alignment spacer between an extrinsic base and an emitter of said NPN transistor;

a second layer of semiconductor material over and insulated from both said substrate and said first layer, said second layer forming all of a gate of said NMOS transistor, a gate of said PMOS transistor, and a control gate of said FAMOS structure;

regions doped with N type material in said substrate to form the sources and drains of said NMOS transistor and FAMOS structure and to form the emitter, collector, and collector contact of said NPN transistor; and regions doped with P type material in said substrate to form the source and drain of the PMOS transistor, the extrinsic bae and intrinsic base of the NPN transistor and to form the channel region of said PMOS transistor.

* * * * *